United States Patent
Katti

(10) Patent No.: US 7,499,313 B2
(45) Date of Patent: Mar. 3, 2009

(54) NONVOLATILE MEMORY WITH DATA CLEARING FUNCTIONALITY

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 202 days.

(21) Appl. No.: 11/446,547

(22) Filed: Jun. 2, 2006

(65) Prior Publication Data
US 2007/0279970 A1 Dec. 6, 2007

(51) Int. Cl.
*G11C 11/00* (2006.01)
(52) U.S. Cl. .................. 365/158; 365/171; 365/173
(58) Field of Classification Search .......... 365/158, 365/171, 173
See application file for complete search history.

(56) References Cited

U.S. PATENT DOCUMENTS

| | | | |
|---|---|---|---|
| 5,756,366 A | 5/1998 | Berg | |
| 6,052,302 A | 4/2000 | Moyer et al. | 365/173 |
| 6,147,922 A | 11/2000 | Hurst | |
| 6,175,525 B1 | 1/2001 | Fulkerson | |
| 6,178,111 B1 | 1/2001 | Sather | |
| 6,455,177 B1 | 9/2002 | Everitt | |
| 6,493,258 B1 | 12/2002 | Lu | |
| 6,512,690 B1 * | 1/2003 | Qi et al. | 365/171 |
| 6,693,826 B1 | 2/2004 | Black, Jr. et al. | 365/173 |
| 6,704,230 B1 | 3/2004 | DeBrosse et al. | 365/201 |
| 7,209,382 B2 * | 4/2007 | Iwata et al. | 365/158 |
| 2003/0206433 A1 | 11/2003 | Hush et al. | 365/160 |
| 2006/0013039 A1 | 1/2006 | Braun et al. | 365/171 |

OTHER PUBLICATIONS

U.S. Appl. No. 11/440,966, filed May 25, 2006, Daniel S. Reed.
U.S. Appl. No. 11/409,371, filed Apr. 21, 2006, Romney R. Katti.
U.S. Appl. No. 11/376,433, filed Mar. 15, 2006, Romney R. Katti.
Hong et al., "Magnetic element Shape for Magnetic Random Access Memory (MRAM)", (May 28-29, 2003) (http://www.cambr.uidaho.edu/symposiums/symp11.asp).
Daughton, "Magnetoresistive Random Access Memory (MRAM)," pp. 1-13 (Feb. 4, 2000).
Hertel, "Thickness Dependence of Magnetization Structures in Thin Permalloy Rectangles", Max-Planck-Institut fur Mikrostrukturphysik, Weinberg 2, 06120 Halle, Germany.
Slaughter, "Magnetic Tunnel Junction Materials for Electronic Applications," JOM (Jun. 2000). (www.tms.org/pubs/journals/JOM/0006/Slaughter/Slaughter-0006.html).

(Continued)

*Primary Examiner*—Richard Elms
*Assistant Examiner*—Nam Nguyen
(74) *Attorney, Agent, or Firm*—McDonnell Boehnen Hulbert & Berghoff LLP

(57) ABSTRACT

A nonvolatile memory and a method of operating the memory are described. The memory includes memory cells that may each include a magnetoresistive memory bit. The memory includes toggle circuitry for altering the resistive states of memory cells within the memory without changing the logical states of the memory cells. The memory may be toggled to balance resistive decay associated with operating a memory bit under certain conditions or in extreme environments.

20 Claims, 7 Drawing Sheets

OTHER PUBLICATIONS

PCT Search Report for PCT/US2007/063009 dated Feb. 26, 2008.
Furayama T., "Trends and Challenges of Large Scale Embedded Memories," Custom Integrated Circuits Conference, 2004. Proceedings of the IEEE 2004 Orlando, FL, USA Oct. 3-6, 2004, Piscataway, NJ, USA, IEEE, Oct. 3, 2004, pp. 449-456, XP010742343, ISBN: 0-7803-8495-4, p. 454.

Jyh-Ming Wang et al., "New Efficient Designs for XOR and NOR Functions on the Transistor Level," IEEE Journal of Solid-State Circuits, IEEE Service Center, Piscataway, NJ, US, vol. 29, No. 7, Jul. 1, 1994, pp. 780-786, XP000460513, ISSN: 0018-9200, figure 3a.

* cited by examiner

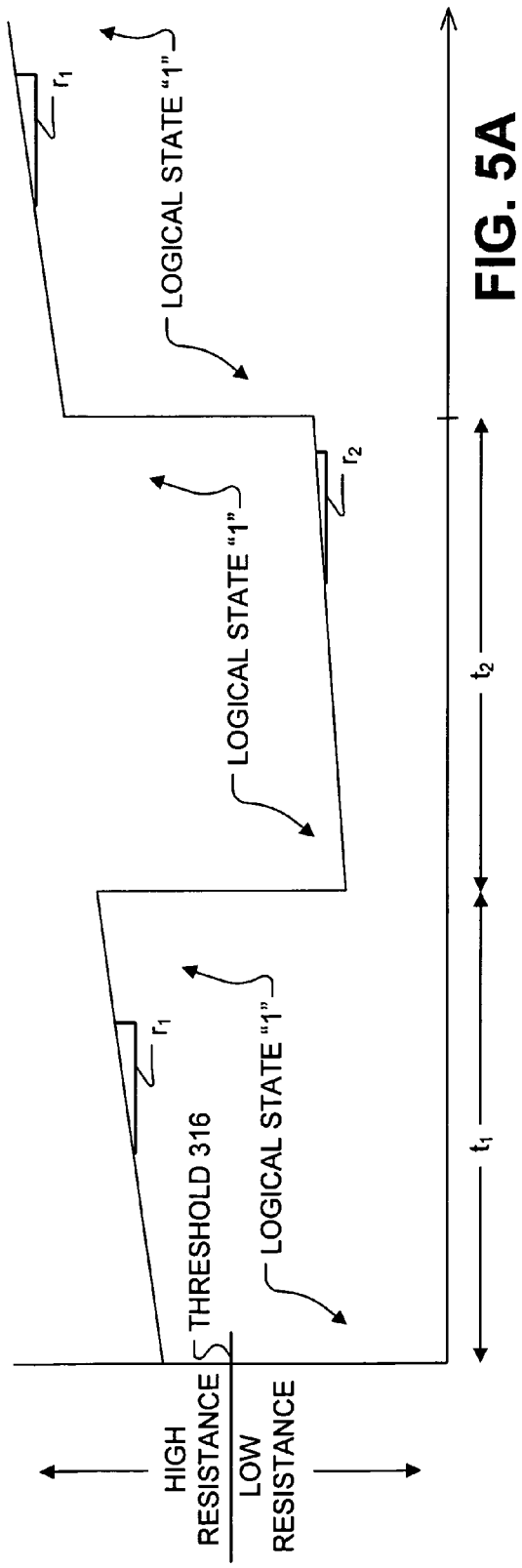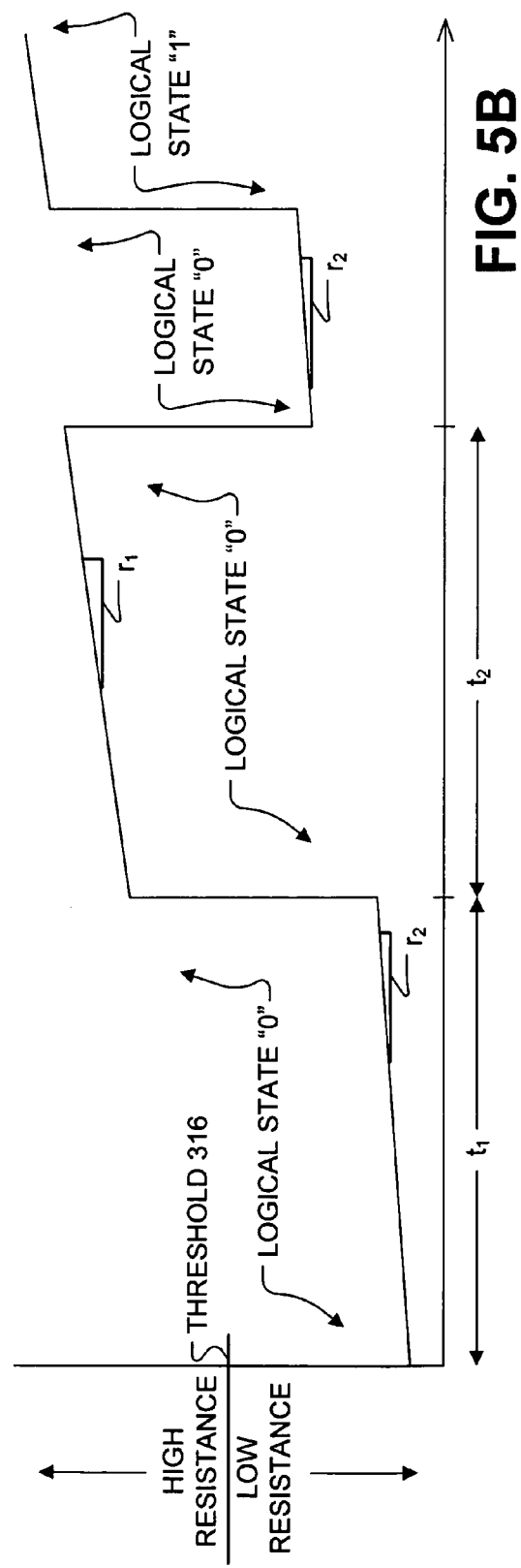

NONVOLATILE MEMORY WITH DATA CLEARING FUNCTIONALITY

GOVERNMENT RIGHTS

The United States Government may have acquired certain rights in this invention pursuant to Contract No. DTRA01-00-C-0002 awarded by the Defense Threat Reduction Agency (DTRA).

FIELD

The invention relates to nonvolatile memory and more particularly to magnetoresistive based memories.

BACKGROUND

The discovery of the giant magnetoresistive (GMR) effect has led to the development of a number of spin-based electronic devices. The GMR effect is observed in certain thin-film devices that are made up of alternating ferromagnetic and nonmagnetic layers. In a typical device, the relative orientations of magnetic directions of the ferromagnetic layers define a binary state of the device. The resistance across a device is generally lowest when the magnetic directions of the ferromagnetic layers are in a parallel orientation and highest when the magnetic directions are in an antiparallel orientation. In a related device, the magnetic tunnel junction (MTJ), the nonmagnetic metal layer is replaced by a thin insulating layer. The tunneling current through this insulating layer can also be measured as a resistance that changes depending on the relative magnetization state of the two layers. The MTJ device generally produces a much larger resistance change than the GMR device.

One type of magnetoresistive device is commonly referred to as a "spin valve." Such devices can be used as data storage elements in magnetic random access memory (MRAM) devices. In this regard, exemplary MRAM applications of magnetoresistive devices are described in U.S. Pat. Nos. 6,147,922; 6,175,525; 6,178,111; 6,493,258, and U.S. Pat. App. Pub. No. 2005/0226064, all of which are incorporated herein by reference.

A spin valve or an MTJ device typically includes two or more ferromagnetic layers that are separated by a thin layer of a non-magnetic material (either a metal or insulator) and also includes an antiferromagnetic layer that "pins" the magnetization direction of one of the ferromagnetic layers. FIG. 1A illustrates (in a simplified form) the layers in a typical spin valve 10 as seen from a side view. As shown in FIG. 1A, the spin valve 10 includes ferromagnetic layers 12 and 14 separated by a nonmagnetic layer 16. In a typical arrangement, one of the magnetic layers is configured to be a fixed layer 14. The fixed layer 14 is adjacent to an anti-ferromagnetic layer 18, such that the magnetization direction of the fixed layer 14 is "pinned" in a particular orientation. The arrow in the fixed layer 14 indicates an exemplary pinned orientation, though, in general, the orientation could be pinned in either direction. Thus, the magnetization direction of the fixed layer 14 remains relatively fixed when operational magnetic fields are applied to spin valve 10. A second magnetic layer 12 is termed a free layer 12. In contrast with the fixed layer 14, the magnetization direction of the free layer 12 is free to switch between parallel and antiparallel orientations, as indicated by the double-arrow symbol in the free layer 12. By applying an appropriate magnetic field to the spin valve 10, the magnetization direction of the free layer 12 can be inverted while the magnetization direction of the fixed layer 14 remains the same.

FIG. 1B shows a three-dimensional view of the spin valve 10 of FIG. 1A. As shown, the spin valve 10 has a hard-axis (short-axis) and an easy-axis (long-axis). In the absence of an applied magnetic field, the magnetization directions of both the free layer 12 and the fixed layer 14 run substantially parallel to the easy-axis.

Typically, a magnetic memory, such as a magnetic random access memory (MRAM) or a magnetic read only memory (MROM), comprises memory cells that include a GMR or MTJ based memory bit. In general, the resistive state of a bit will be associated with one of two logical states: a binary value of "0" or a binary value of "1."

Unfortunately, as a memory is operated over time, the resistive states of a memory bit may degrade, causing a degree of uncertainty within a memory bit. For example, temperature variations may cause the resistance of a memory bit to shift. In addition, if the memory is exposed to an extreme environment, such as a radiation environment, the resistance of the memory bit may increase over time. If the resistance of a particular memory bit degrades too much, the memory bit may be indicative of an incorrect logical state. Consequently, if this fault is not corrected, the memory may produce a deleterious influence on downstream circuitry and applications that use the memory. Therefore, it is desirable to produce a memory that supports reliable data clearing and sanitization.

SUMMARY

A non-volatile memory and a method of operating the memory are presented. In one example, a non-volatile memory comprises a magnetoresistive based memory cell that includes a memory bit that has at least a high and a low resistive state. The memory bit may be an MTJ device, for example. The memory also includes toggle circuitry coupled to the memory cell. The memory may use the toggle circuitry to change the resistive state of the memory bit without changing the logical state of the memory bit.

In one example, the toggle circuitry includes input and output circuitry. The input circuitry may be used to change the resistive state of the memory bit and the output circuitry may be used to produce a data signal associated with a particular resistive state of the memory bit. The output circuitry may include a sense amplifier, for example. Moreover, the output circuitry may also include an inverter and selection circuitry, which together, may be used to maintain a proper logical state of the memory cell.

In another example, a toggle signal may be communicated to the toggle circuitry. The toggle signal may be used along with the toggle circuitry to change the resistive state of the memory cell. In a further example, the toggle circuitry may receive the toggle signal when the memory element degrades beyond a predetermined resistive threshold. In an alternative example, the toggle circuitry may be coupled to a counter that generates the toggle signal after a predetermined amount of time expires.

In general, the memory may include a plurality of memory cells. The toggle circuitry may be coupled to one or more memory cells. The memory may also include a multiplexer for communicating write signals to any of the memory cells within the memory. In one example, the toggle circuitry may be configured to perform an inversion routine. In such a routine, the memory uses the multiplexer to cycle through each of the memory cells within the plurality of memory cells and change resistive states. Although the resistive states are changed, the toggle circuitry does not change the logical states associated with each memory cell within the plurality of memory cells.

In an alternative example, a method of operating a memory is described. The method includes providing a memory cell that includes a magnetoresitive based memory bit in a first resistive state, altering the memory bit so as to change the memory bit to a second resistive state, and associating the second resistive state with the first logical state and the first resistive state with a second logical state.

In one example, altering the memory bit may be performed by reading the memory cell to determine a stored logic state of the memory bit and writing an inverse of the stored logic state to the memory cell. Moreover, the memory cell may be located within a plurality of memory cells and an inversion routine may be used to alter the memory bit associated with each memory cell. In an additional example, altering the memory bit may be carried out via the toggle signal. The toggle signal may be generated after a predetermined amount of time expires, or after a resistance associated with the memory element decays past a predetermined threshold.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

FIGS. 5A and 5B are diagrams illustrating resistive decay and memory cell toggling;

DETAILED DESCRIPTION OF THE DRAWINGS a) Memory Cell Architecture

Figure 1A:
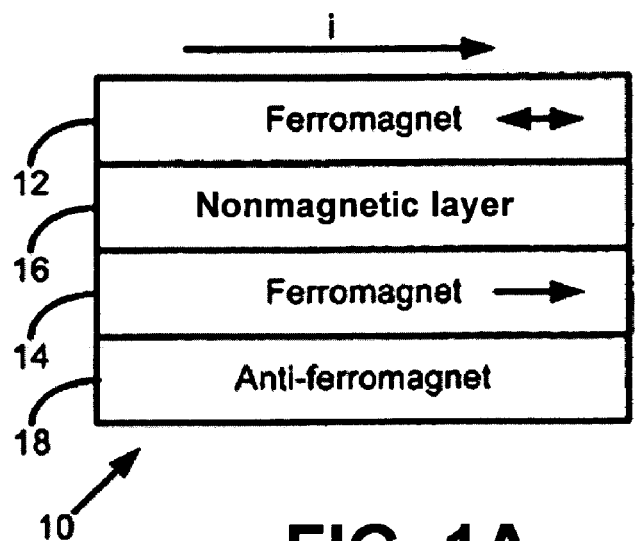
FIG. 1A is a schematic diagram of the layers of a prior art spin valve.
Figure 1B:
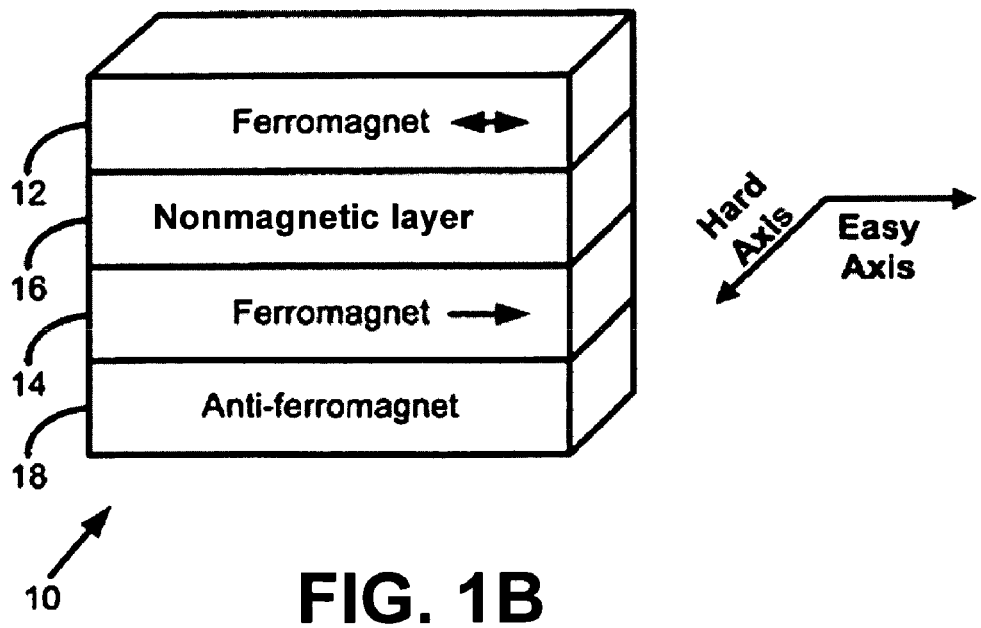
FIG. 1B is a three dimensional view of a prior art spin valve.
Figure 2:
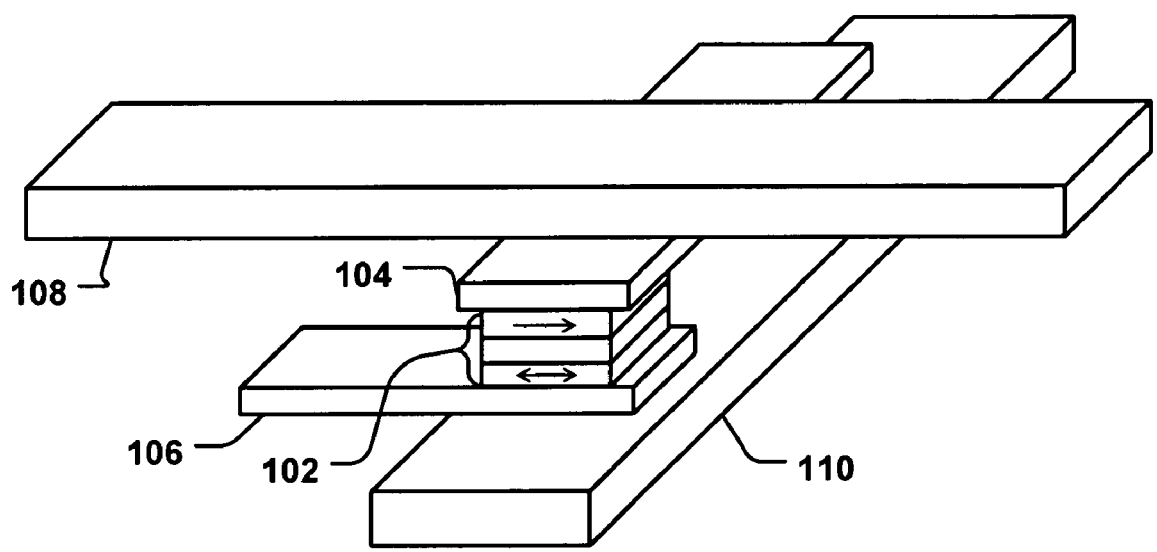
FIG. 2 is a three dimensional view of a spin valve showing conducting lines for reading and writing.

Referring to the drawings, FIG. 2 generally depicts a magnetic memory cell with separate read and write architecture. A magnetoresistive memory bit 102 is shown as a tri-layer element having a spacer layer sandwiched between two conducting magnetic layers. Each magnetic layer of the memory bit 102 has a magnetization direction. In FIG. 2, the top magnetic layer is shown with a single headed arrow indicating that the magnetization direction of the top magnetic layer does not change during operation of the cell. Thus, the top magnetic layer is known as the reference, or pinned layer. The bottom magnetic layer is shown with a double headed arrow indicating that the magnetization direction of the bottom magnetic layer can be inverted during operation of the cell. Thus, the bottom magnetic layer is known as the storage, or free layer. As one skilled in the art will recognize, the orientation of the layers can be altered without eliminating the usefulness of the memory bit 102.

A first read line 104 is coupled to a first side of the memory bit 102 and a second read line 106 is coupled to a second side of the memory bit 102. The two read lines are arranged such that a voltage difference between the first read line 104 and the second read line 106 will generate a current flowing through the layers of the memory bit 102. The first read line 104 may run perpendicular to the second read line 106. However, as one skilled in the art will understand, this arrangement is not necessary. For example, in alternative examples, the second read line 106 does not run perpendicular to first read line 104, but rather terminates at a ground after passing through a select transistor.

A first write line 108 is shown above the first read line 104. The first write line 108 is separated from the first read line 104 and from the rest of the cell by a first insulative spacer (not shown). The first write line 108 is arranged near the memory bit 102 such that a current passing through the first write line 108 creates a magnetic field that acts on the memory bit 102.

A second write line 110 is shown below the second read line 106. The second write line 110 is separated from the second read line 106 and from the rest of the cell by a second insulative spacer (not shown). The second write line 110 is arranged near the memory bit 102 such that a current passing through the second write line 110 creates a magnetic field that acts on the memory bit. The first write line 108 is generally arranged to run perpendicular to the second write line 110. However, as one skilled in the art will understand, this arrangement is not necessary.

A logical state of the cell depends upon the relative orientation of the magnetization directions of the magnetic layers of the memory bit 102. Thus, the logical state of the cell is set by orientating the magnetization layers. A first current passing through the first write line 108 and a second current passing through the second write line 110 create a combined magnetic field. The combined magnetic field acts on the memory bit 102 to invert the orientation of the magnetization direction of the free layer of the memory bit 102.

To determine the logical state of the memory bit 102, a voltage difference is created between the first read line 104 and the second read line 106. The voltage difference results in a tunneling current passing perpendicularly through the layers of the memory bit 102. The value of the tunneling current is indicative of the logical state of the memory bit 102. The arrangement shown in FIG. 2 may be most applicable to a memory bit with a high top to bottom resistivity such as an MTJ. In an additional example, such as where the spacer layer is a conductive layer, the read lines may be coupled with the bit ends so that the read current flows along the easy axis of the memory bit. A sense current (in lieu of a tunneling current) may run through the conductive layer. This sense current may terminate at a ground after passing through a select transistor (not shown), as described above. In this case, the value of the sense current is indicative of the logical state of the memory bit.

b) Magnetic Switching Process

Figure 3:
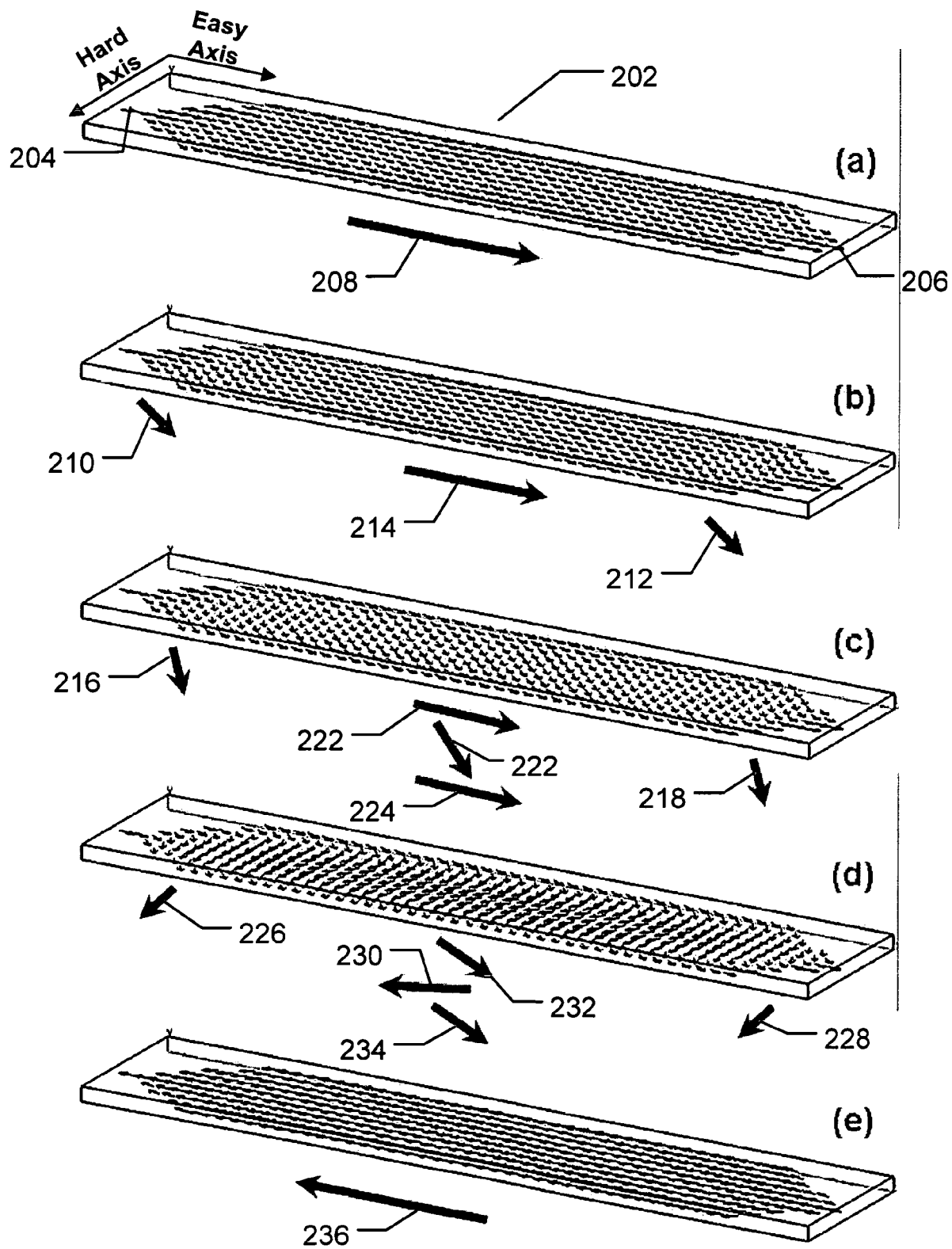
FIG. 3 is a sequential diagram of a magnetic switching process in a magnetic layer.

In a magnetoresistive memory bit with a pair of magnetic layers, a logical state of the memory bit is determinable from the magnetization directions of the magnetic layers. The logical state may be switched from a first state to a second state by switching (or inverting) the magnetization direction of one of the magnetic layers. Referring to FIG. 3, a series of frames chronicle a finite analysis of a magnetic switching process in a magnetic layer of a magnetoresistive memory bit in a prophetic example. In general, the series shows that the switching process involves a coordinated rotation (or reversal) of elemental magnetization directions within the magnetic layer.

Looking first at Frame (a), a magnetic layer 202 is shown as an elongated element with tapered bit ends. For convenience, the bit ends are labeled a first bit end 204 and a second bit end 206. An easy-axis (long-axis) of the magnetic layer 202 is shown running parallel to the elongation of the magnetic layer 202. A hard-axis (short-axis) is aligned in the plane of the magnetic layer 202 and runs perpendicular to the easy-axis. Within magnetic layer 202, elemental magnetization directions are shown as small arrows pointing along the easy-axis toward the second bit end 206. Magnetic exchange between the bit ends and the body of the bit would tend to make the magnetization uniform and unidirectional. (Magnetization exchange is the ferromagnetic exchange that tends to magnetize a magnetic domain of an ensemble of atoms in a given direction.)

A summary arrow 208 shows a composite magnetization direction of the magnetic layer 202 pointing along the easy-axis toward the second bit end 206. The uniform magnetization along the easy-axis as shown in Frame (a) is indicative of a first logical state.

Frames (b), (c), (d), and (e) represent the magnetic layer 202 in sequential scenes of a switching process. Thus, in parallel fashion, the first bit end 204 is the leftmost end of the magnetic layer in each frame, and the second bit end 206 is the rightmost end of the magnetic layer in each frame.

Jumping to Frame (e), the final frame, elemental magnetization directions are shown pointing along the easy-axis toward the first bit end 204. Frame (e) summary arrow 236 shows a generalized magnetization direction pointing in the opposite direction of the Frame (a) summary arrow 208. The uniform magnetization along the easy-axis as shown in Frame (e) is indicative of a second logical state. Thus, the objective of a switching process is to switch the logical state of the magnetization layer 202 from the first logical state to the second logical state. Frames (b), (c), and (d) give further detail of the switching process.

In Frame (b), the elemental magnetization directions as shown by small arrows in the magnetic layer are no longer uniform across the entire magnetic layer. Specifically, elemental magnetization directions at the bit ends have begun to rotate clockwise toward the hard-axis. However, elemental magnetization directions in the elongated portion of the magnetic layer continue to point toward the second bit end 206. Frame (b) summary arrows 210, 212, and 214 mirror the elemental magnetization. In Frame (b), it can be seen that the switching process is initiated in the bit ends 204 and 206.

In Frame (c), the elemental magnetization directions show further rotation. Frame (c) summary arrows 216-224 mirror the rotation of the elemental magnetization directions. The bit end summary arrows 216 and 218 indicate further rotation of elemental magnetization directions at the bit ends 204 and 206. A center of the elongated portion of the magnetic layer has begun to rotate clockwise as shown by the center summary arrow 220. The edge summary arrows 222 and 224 show little rotation and indicate that elemental magnetization directions along edges of the elongated portion continue to substantial point toward the second bit end 206.

In Frame (d), bit end summary arrows 226 and 228 indicate continued rotation of elemental magnetization directions in the bit ends 204 and 206. The center of the elongated portion continues to rotate as shown by summary arrow 230. Edge summary arrows 232 and 234 indicate that elemental magnetization directions along the edges has begun to rotate in earnest.

Finally, Frame (e) shows a completed rotation and reformation of the uniformity of elemental magnetization directions across the magnetic layer. FIG. 3 in general shows how switching of the magnetization direction of the magnetic layer is initiated in the bit ends, continues through the center of the layer, and completes with reversal of the edges.

Although each intermediate frame (b), (c), (d) include elemental magnetization directions in several different directions, composite magnetization directions can be calculated through, for instance, an elemental average. In an alternative example, the composite magnetization directions for the frames are shown by the center summary arrows 214, 220, and 230.

As will be understood by one skilled in the art, the first and second logical states may be arbitrarily selected. Thus switching the magnetic layer from the second logical state to the first logical state involves a mirror-image procedure as switching from the first logical state to the second logical state. FIG. 3 is intended to serve as an example of a switching process and should not be seen as limiting. In addition, it should be understood that a variety of GMR based spin valves, or other type of magnetoresistive memory bits, may be used in the memory described below.

c) Magnetic Memory

A magnetic memory may include a plurality of memory cells arranged in column arrays and row arrays. Alternative configurations, that do not include a column and row configuration, may also be used. Each memory cell within the memory includes a magnetoresistive-based memory bit (e.g., a GMR bases spin valve, a MTJ device, etc.).

In a column and row configuration, the column and row arrays include conductive data lines that may each carry a current. The data lines are used to write and/or read memory cells. To write a memory cell, a current in a data line generates a magnetic field that is proximal to a memory cell's memory bit. To read a memory cell, a current in a data line passes through a memory cell's memory bit and a resistance is sensed, which, as described above, may be performed in a variety of ways. Typically, one of the column or row arrays will include data lines that run underneath memory cells. The other array will include data lines that run above the memory cells.

In general, at least two data lines are used to write a memory cell: a data line above the memory cell and a data line below the memory cell. Both data lines together create an aggregated magnetic field that may cause a memory bit within the memory cell to flip to either a parallel state or an antiparallel state. Two data lines are generally preferred in order to prevent an inadvertent write to a neighboring memory cell. However, a memory may use more or fewer data lines to write to a memory cell. Memories that do not have a column and row configuration, for example, may use only one data line per memory cell.

To read a memory cell, the same data lines used for a write may be employed, or separate data lines may provide access to a memory cell. The implementation of the architecture may depend on the type of memory bit that a memory cell includes. It should be understood, therefore, that a variety of architectures are possible.

Figure 4:
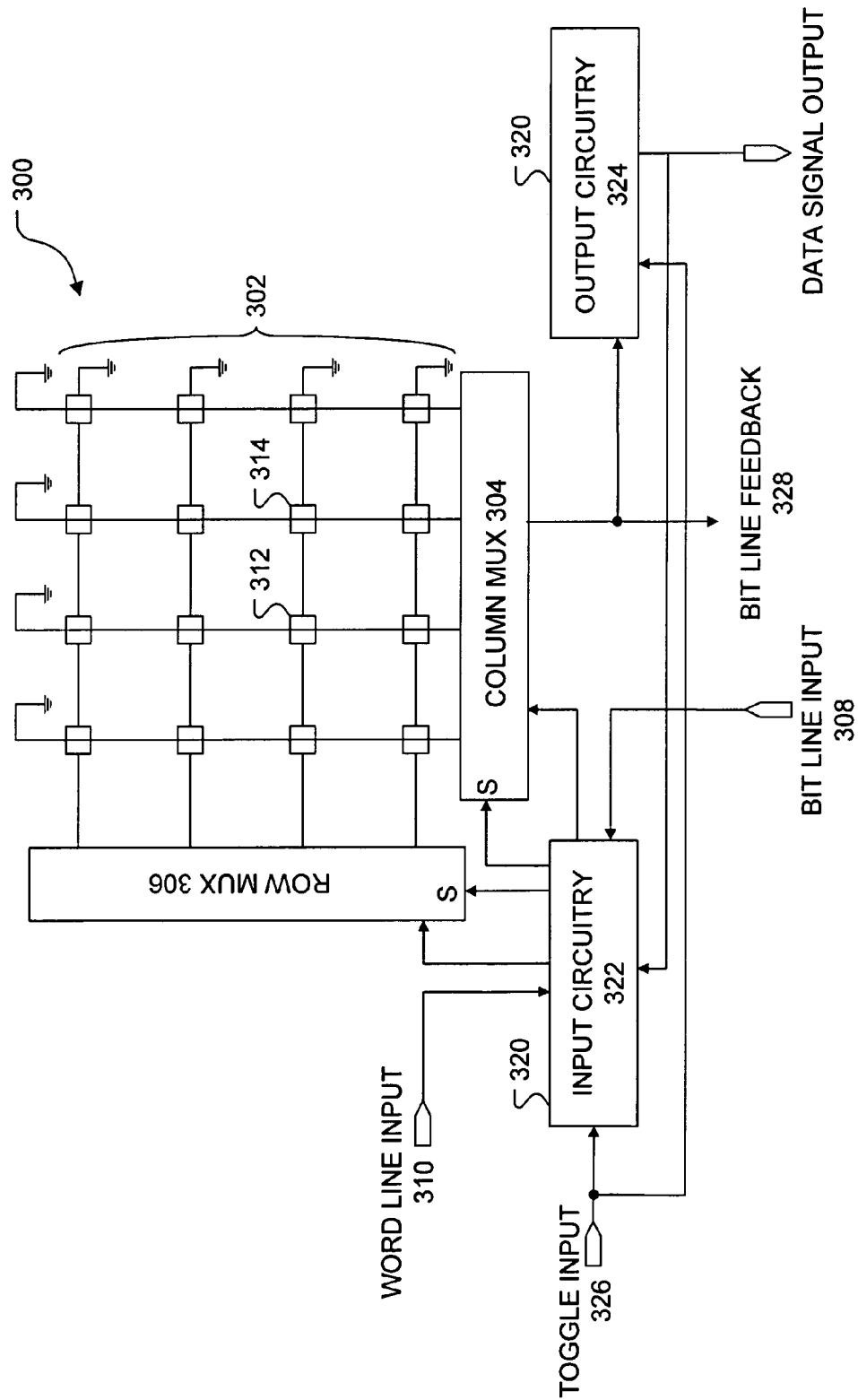
FIG. 4 is a block diagram of a memory comprising memory cells coupled to toggle circuitry.

FIG. 4 shows a magnetic memory 300 that includes a plurality of memory cells 302. Each memory cell within the memory cells 302 includes at least one magnetoresistive memory bit. A read architecture may be integrated into the configuration of FIG. 4 or a separate read architecture may be used to read any one of the memory cells 302. Although the description below is primarily directed to writing the memory 300, it should be understood that the memory 300 and similar implementations are not limited by the type of read architecture employed.

To write the memory 300, a write signal may be provided to a memory cell via a set of data lines. The memory 300 includes a column multiplexer (MUX) 304 and a row MUX 306 for applying a write signal to the memory bit within an individual memory cell. The write signal may be applied at the bit line and word line inputs 308, 310. Together, the column and row MUXes 304, 306 communicate the write signal to a target memory cell. In some examples, the multiple memory cells may be written to at the same time. The memory 300 may also include current drivers (not shown) for reading and writing any of the memory cells 302.

d) Toggling the Memory

As described above, the magnetoresitive bit within each of the memory cells 302 may degrade over time. FIGS. 5A-B show example diagrams of a resistance associated with two memory cells 312, 314 which are located within the memory cells 302 (see FIG. 4). FIG. 5A shows the memory cell 312 initially in a high resistive state, which during an interval $t_1$ is indicative of a logical state of "1." FIG. 5B shows the memory cell 312, which during the interval $t_1$ is in a logical state of "0." In general, when a memory cell has a resistance below a resistance threshold 316, the memory cell is considered to be in a first logical state. On the other hand, if the resistance is above the threshold 316, the resistance is considered to be in a second logical state.

During the interval $t_1$, FIGS. 5A-B also show the resistance associated with each of the memory cells 312, 314 respectively increasing at a rate $r_1$ and a rate $r_2$. As described above, such resistance increases may be attributed to temperature, and/or operating a memory over a long time period. For example, the interval $t_1$ may be one or more years. Additionally, resistance increases may also be attributed to a radiation environment.

Each of the FIGS. 5A-B show that resistance increases at a faster rate when the memory cells 312, 314 are in a high resistive state. For instance, during the interval $t_1$, the resistance of the memory cell 312 degrades at the rate $r_1$, which is faster than the degradation associated with the rate $r_2$. If the memory cells 313, 314 as well as any of the memory cells 302 were allowed to degrade at varying rates, reading the memory 302 may become increasingly difficult. However, by subjecting the memory 300 (along with the memory cells 312, 314) to data clearing or sanitization via memory toggling, the memory bits associated with each of the memory cells 302 may decay at substantially the same rate, allowing the relative difference between high and low resistive states to remain substantially the same.

Returning to FIG. 4, memory toggling may be performed via toggle circuitry 320, which is coupled to the memory cells 302. In operation, the toggle circuitry 320 "toggles" the memory 300 by altering the resistive states of the memory cells 302 and re-associating a logical state with the altered memory cells. The toggle circuitry 320 includes input circuitry 322 and output circuitry 324. Generally speaking, the input circuitry 322 alters the resistive states of the memory cells 302 (including memory cells 312, 314) and the output circuitry 324 generates a data signal that corresponds to the logical state of a memory cell. In particular, the toggle circuitry 320 may be used to alter the resistive states of the memory cells 302 without altering the logical states. Although shown as comprising input and output circuitry 322, 324, the toggle circuitry 320 may take on a variety of forms and the example in FIG. 4 should not be viewed as limiting.

In general, the toggle circuitry 320 compensates for the varying rates of resistance changes by periodically changing the resistive states of the memory cells 302. For example, in the FIGS. 5A-B, during an interval $t_2$, the resistive state of the memory cells 312, 314 are toggled (e.g., via the input circuitry 322). However, the logical states are not toggled. Instead, FIG. 5A shows that the logical state "1" is re-associated with a low resistive state and FIG. 5B shows that the logical state "0" is re-associated with a high resistive state. The output circuitry 324, for example, may be configured to perform such re-association.

During the interval $t_2$, the resistance of the memory cell 312 degrades at the rate $r_2$ and the resistance of the memory cell 314 degrades at the rate $r_1$. After the interval $t_2$, the toggle circuitry may once again toggle the resistive states of the memory cells 312, 314 and re-associate logical states. Accordingly, although the memory cells 312, 314 are in different resistive states, the toggle circuitry 320 allows the memory cells 312, 314 to degrade at substantially the same rate, which may be defined as:

$$r_3 = (r_1 t_1 + r_2 t_2)/(t_1 + t_2)$$

where $r_3$ is a degradation rate over both the intervals $t_1$ and $t_2$.

It is also important to note that the memory cells 312, 314, although periodically toggled by the toggle circuitry 320, may still be written and read. What is more, the toggle circuitry 320 allows the "toggling" to be transparent to circuitry external to the memory 300. For example, after the interval $t_2$, FIG. 5B shows a write of a logical state of "1" to the memory cell 314. Accordingly, the resistive state of the memory cell 314 is changed from low to high and the logical state is changed from a "0" to "1".

e) Toggling Circuitry

The toggling circuitry 320 may comprise various configurations. FIG. 4 shows the toggle circuitry 320 coupled to a toggle input 326, which may be used to communicate a toggle signal to both the input circuitry 322 and the output circuitry 324. In other examples, the memory 300 may also be configured so that it operates without the toggle input 326. Alternatively, the toggle signal may be communicated exclusively to either the input circuitry 322 or the output circuitry 324.

The toggle signal, in general, may be indicative of whether or not the memory 300 should be toggled. In one example, the toggle signal may be communicated to the toggle circuitry 320 when a memory cell within the memory cells 302 decays beyond a predetermined resistive threshold. Accordingly, a bit line feedback 328 may be communicated to feedback circuitry (not shown) which determines whether one or more memory cells has degraded beyond the predetermined resistive threshold. When such degradation has occurred, the feedback circuitry, for example, may generate the toggle signal. In addition, the feedback circuitry may re-set or increase the predetermined resistive threshold.

Alternatively, the toggle circuitry 320 may be coupled to a counter (not shown). The counter may communicate the toggle signal to the toggle circuitry when a predetermined amount of time has expired, insuring that the resistive degradation of the memory 300 is uniform. In a further example, the counter may determine the intervals $t_1$ and $t_2$, and the predetermined amount of change may be dynamically calculated. In such an example, the predetermined amount of time may be based on how many of the memory cells 302 are in low and high resistive states.

Figures 6A, 6B:
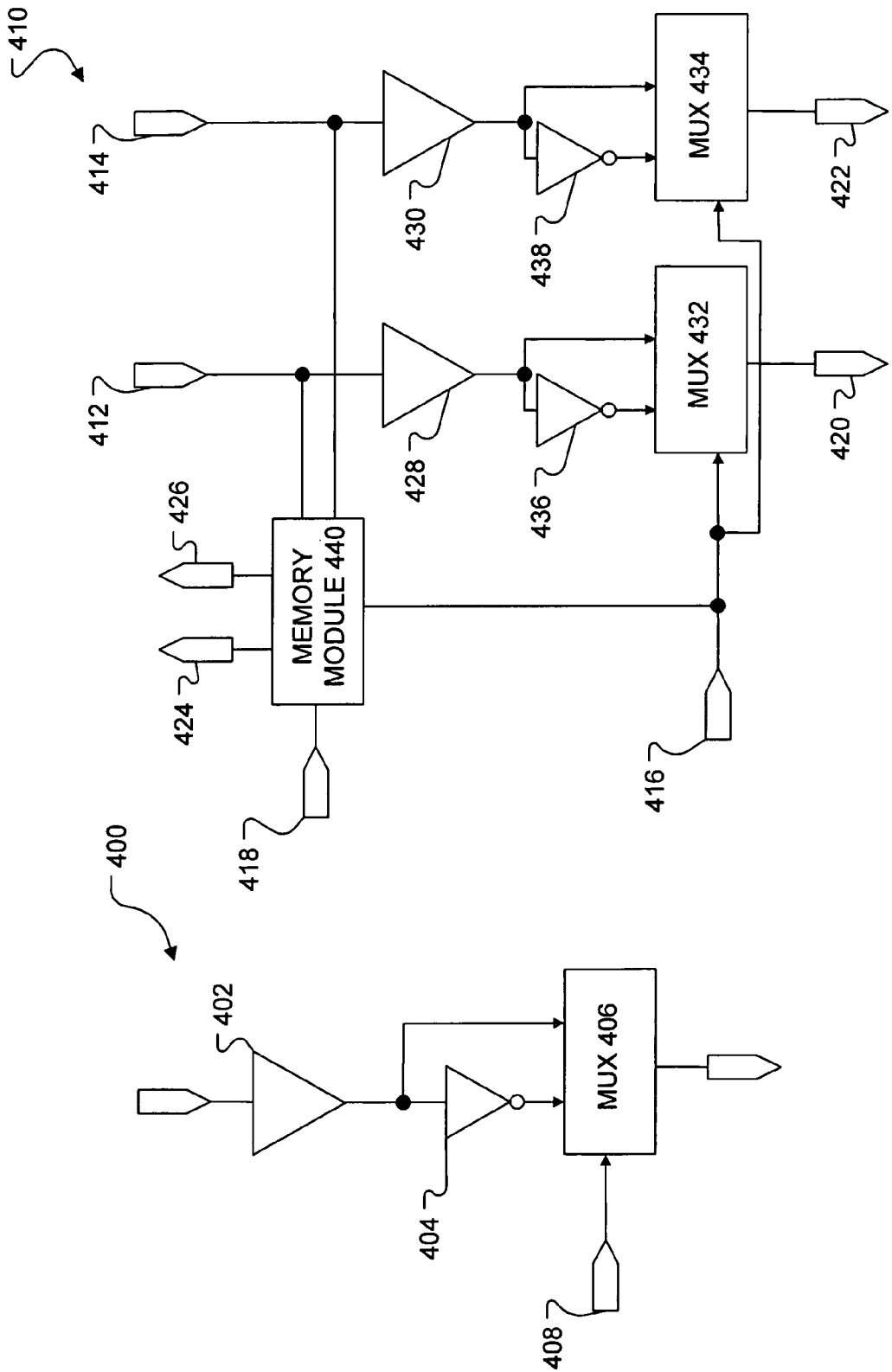
FIG. 6A is a block diagram of output circuitry.
FIG. 6B is a block diagram of input circuitry.

FIG. 6A shows example output circuitry 400, which comprises a sense amplifier 402, an inverter 404, and a MUX 406. The sense amplifier 402, which may be coupled to the MUX 304 (see FIG. 4), may use a sense current to determine the resistive state of a memory cell and output a data signal indicative of the resistive state. The data signal is communicated to both the inverter 404 and the MUX 406. In this example, the MUX 406 may use the toggle signal (applied at a toggle input 408) to associate a logical state with a resistive state. For instance, if the MUX 406 does not receive a toggle signal, the MUX 406 may directly receive the data signal and associate a low resistive state with a logical state of "1" and a high resistive state with a logical state of "0." However, if the MUX 406 receives the toggle signal, the MUX 406 may select an inverse of the data signal as an output signal, associating a low resistive state with a logical state of "1" and a high resistive state with a logical state of "0."

FIG. 6B shows example input circuitry 410. The input circuitry 410 includes a bit line input 412, a word line input 414, a toggle input 416, and a data signal input 418. The input circuitry produces output signals at outputs 420, 422 for writing, and select signals at select outputs 424, 426 for selecting a memory cell within a memory to be written. The outputs 424, 426, for example, may be coupled to the select inputs of MUXes 304, 306. The input circuitry 410 also includes current drivers 428, 430, MUXes 432, 434, inverters 436, 438, and a memory module 440.

Operationally, when the toggle input 416 receives an input signal, the input circuitry 410 may perform an inversion routine that cycles through the memory cells within a memory. During a cycle, the input circuitry 410 may use the memory module 440 to first store an original resistive state associated with a memory cell (data signal feedback at the data signal output 418), and then use the current drivers 428, 430 to write an inverse of the original resistive state.

The input circuitry 410 uses the MUXes 432, 434 and the inverters 436, 438 to invert input signals at the bit and word line inputs 412, 414 and to invert output from the memory module 440. Using the toggle signal, the MUXes 434, 436 may insure that a memory remains transparent to external circuitry so that such circuits do not need to change input or output signaling to accommodate a toggled memory.

f) A Method of Toggling a Memory

Figure 7:
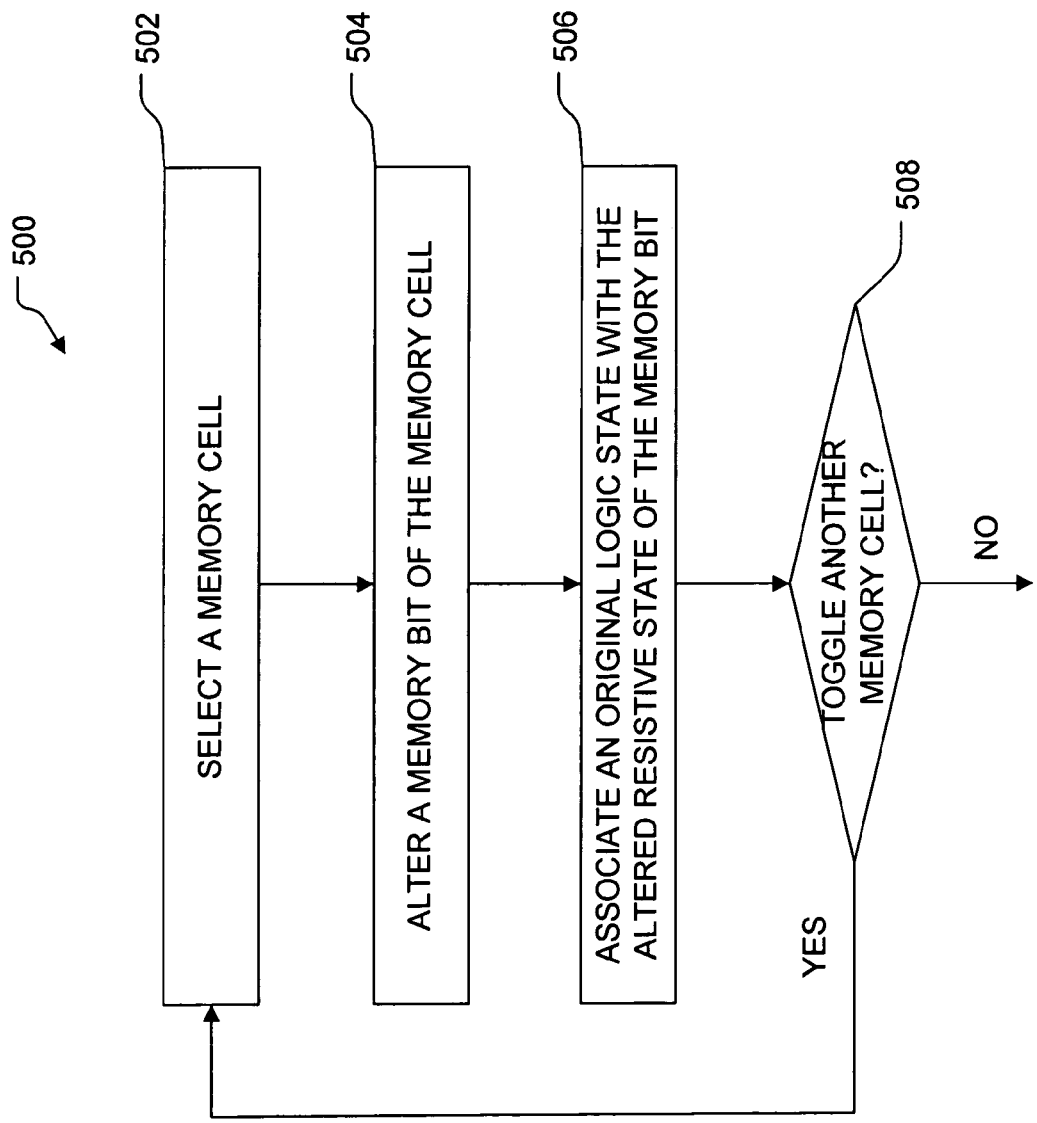
FIG. 7 is a flow diagram of a method of toggling a memory.

FIG. 7 is flow diagram showing a method 500 of toggling a memory. At block 502 a memory cell is selected. In most examples, a memory will comprise multiple memory cells. Moreover, the method 500 may be applied to one or more memory cells, or a partitioning of memory cells within a memory. For example, the method 500 may be applied to memory cells that share a common sense amplifier.

At block 504, a memory bit of the memory cell is altered. As describe above, altering the memory bit may include changing the resistive state of the bit from a high to a low resistive state or vice versa. This may be performed, for example, by reading the memory cell to determine a stored logic state of the memory bit, and writing an inverse of the stored logic state to the memory cell. In addition, the block 504 may be initiated upon receiving a toggle signal.

To retain the original logical state of the bit, the method 500 also includes a block 506, which associates the original logic state with the altered resistive state. As describe above, an inverters and a MUX located within output circuitry may use a toggle signal to produce an inverted data signal.

At the block 508, the method 500 may be applied to other memory cells within a memory. For example, the method 500 may be applied numerous times during an inversion routine. Moreover, the method 500 may be applied each time a memory is to be toggled.

g) CONCLUSION

A variety of examples have been described above. More generally, those skilled in the art will understand that changes and modifications may be made to these examples without departing from the true scope and spirit of the present invention, which is defined by the claims. Thus, for example, the memory should not be limited to the type of memory bit that a memory cell comprises. Moreover, the illustrated memories are comprised of sixteen memory cells; however, memories with a greater number of memory cells may benefit from partitioning. These illustrations contain a reduced number of cells in order to generally convey the structure and method of partitioning a memory. The memory cells may also be grouped into memory words, where a set of bit lines provides reading and writing access to a particular memory word. In addition, although magnetic based memories are illustrated, it is contemplated that other non-volatile memories may also benefit from the partitioning described herein. Finally, device design, processing, and test conditions all affect magnetization switching characteristics and are therefore should be considered.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A memory comprising:
a first memory cell including a first magnetoresistive based memory bit that has at least two resistive states; and
toggle circuitry coupled to the first memory cell for changing a resistive state of the first memory bit without changing a logical state of the first memory bit.

2. The memory as in claim 1, wherein the toggle circuitry is coupled to receive a toggle signal for the changing of the resistive state of the first memory bit.

3. The memory as in claim 2, wherein the toggle signal is communicated to the toggle circuitry when a resistance of the first memory bit degrades beyond a predetermined resistive threshold.

4. The memory as in claim 2, further comprising a counter coupled with the toggle circuitry, wherein the counter enables the toggle circuitry after a predetermined amount of time expires.

5. The memory as in claim 1, wherein the toggle circuitry comprises:
input circuitry for the changing of the resistive state of the first memory bit; and
output circuitry for generating a data signal representative of the logical state of the first memory bit.

6. The memory as in claim 5, wherein the output circuitry comprises a sense amplifier.

7. The memory as in claim 5, wherein the output circuitry comprises:
a sense amplifier for generating a sense signal;
an inverter coupled to an output of the sense amplifier for inverting the sense signal; and
selection circuitry coupled to receive the sense signal and the inverted sense signal, wherein the selection circuitry uses the toggle signal to toggle between outputting the sense signal and the inverted sense signal.

8. The memory as in claim 1, wherein the first memory bit comprises a magnetic tunneling junction device.

9. The memory as in claim 1, further comprising a second memory cell including a second magnetoresistive based memory bit, wherein the toggle circuitry is coupled to the second memory cell, and wherein the toggle circuitry is also for changing a resistive state of the second memory bit without changing a logical state of the second memory bit.

10. The memory as in claim 9, wherein the toggle circuitry comprises a first sense amplifier coupled to the first memory cell and a second sense amplifier coupled to the second memory cell.

11. The memory as in claim 9, further comprising a multiplexer coupled to the memory cell for routing a write signal to at least one of the first and the second memory cells.

12. The memory as in claim 11, wherein the toggle circuitry is configured to perform an inversion routine, wherein the inversion routine changes the resistive state of both the first and the second memory bits without changing the logical state of the first and the second memory bits.

13. A method of operating a memory, the method comprising:
   providing a memory cell including a first magnetoresistive based memory bit in a first resistive state, wherein the first resistive state is associated with a first logical state;
   altering the memory bit so that the memory element is in a second resistive state; and
   associating the second resistive state with the first logical state and the first resistive state with a second logical state.

14. The method as in claim 13, wherein altering the memory element comprises:
   reading the memory cell to determine a stored logic state of the memory bit; and
   writing an inverse of the stored logic state to the memory cell.

15. The method as in claim 14, wherein the memory cell is positioned within a plurality of memory cells and wherein altering the memory bit comprises performing an inversion routine on the plurality of memory cells.

16. The method as in claim 13, further comprising outputting a data signal associated with the memory cell.

17. The method as in claim 16, wherein associating the second and the first resistive states comprises inverting the data signal.

18. The method as in claim 13, wherein altering the memory bit comprises the memory cell receiving a toggle signal.

19. The method as in claim 18, wherein the tuning signal is generated after a predetermined amount of time expires.

20. The method as in claim 18, wherein the tuning signal is generated after the memory element decays past a predetermined resistive threshold.

* * * * *